United States Patent
Houten et al.

(10) Patent No.: US 11,239,000 B2
(45) Date of Patent: Feb. 1, 2022

(54) SYSTEM AND METHOD FOR THERMIONIC ENERGY CONVERSION

(71) Applicant: Spark Thermionics, Inc., Berkeley, CA (US)

(72) Inventors: Kyana Van Houten, Berkeley, CA (US); Lucas Heinrich Hess, Berkeley, CA (US); Jared William Schwede, Berkeley, CA (US); Felix Schmitt, Berkeley, CA (US)

(73) Assignee: Spark Thermionics, Inc., Emeryville, CA (US)

( * ) Notice: Subject to any disclaimer, the term of this patent is extended or adjusted under 35 U.S.C. 154(b) by 0 days.

(21) Appl. No.: 17/313,945

(22) Filed: May 6, 2021

(65) Prior Publication Data

US 2021/0350947 A1   Nov. 11, 2021

Related U.S. Application Data

(60) Provisional application No. 63/020,986, filed on May 6, 2020.

(51) Int. Cl.
*H02N 10/00* (2006.01)
*G21H 1/10* (2006.01)
*H01J 45/00* (2006.01)

(52) U.S. Cl.
CPC ............ *G21H 1/106* (2013.01); *H01J 45/00* (2013.01)

(58) Field of Classification Search
CPC ....... H01L 23/04; H01L 23/051; H01L 35/00; H01L 35/30; H01J 45/00; G21H 1/106
USPC ........................................................ 310/306
See application file for complete search history.

(56) References Cited

U.S. PATENT DOCUMENTS

| | | | |
|---|---|---|---|
| 3,155,849 A | 11/1964 | Lawrence et al. | |
| 3,482,120 A | 12/1969 | Wilson | |
| 3,740,592 A | 6/1973 | Engdahl et al. | |
| 3,843,896 A | 10/1974 | Rason et al. | |
| 3,932,776 A * | 1/1976 | Dunlay ............... | G21H 1/106 310/306 |
| 5,612,588 A | 3/1997 | Wakalopulos | |

(Continued)

FOREIGN PATENT DOCUMENTS

| | | | |
|---|---|---|---|
| CA | 2367686 A1 * | 10/2000 | ............ H01L 35/30 |
| JP | H0575104 A | 3/1993 | |

(Continued)

OTHER PUBLICATIONS

J.W. Schwede et al: "Photon-enhanced thermionic emission from heterostructures with low interface recombination", Nature Communications, vol. 4, No. 1, Jun. 12, 2013 (Jun. 12, 2013), XP055759289, DOI: 10.1038/ncomms2577.

(Continued)

*Primary Examiner* — Brook Kebede
(74) *Attorney, Agent, or Firm* — Jeffrey Schox; Samuel Rosenthal

(57) ABSTRACT

A thermionic energy conversion system, preferably including one or more electron collectors, interfacial layers, encapsulation, and/or electron emitters. A method for manufacturing the thermionic energy conversion system. A method of operation for a thermionic energy conversion system, preferably including receiving power, emitting electrons, and receiving the emitted electrons, and optionally including convectively transferring heat.

20 Claims, 6 Drawing Sheets

(56) References Cited

U.S. PATENT DOCUMENTS

| | | | |
|---|---|---|---|
| 5,675,972 A | 10/1997 | Edelson | |
| 2010/0019619 A1 | 1/2010 | Hagg | |
| 2010/0104450 A1 | 4/2010 | Longoni et al. | |
| 2010/0001397 A1 | 6/2010 | Schwede | |
| 2010/0139771 A1 | 6/2010 | Schwede et al. | |
| 2011/0100430 A1 | 5/2011 | Zak et al. | |
| 2011/0139205 A1 | 6/2011 | Kimura et al. | |
| 2011/0221328 A1 | 9/2011 | Nemanich et al. | |
| 2011/0226299 A1 | 9/2011 | Makansi | |
| 2012/0299438 A1 | 11/2012 | Kimura et al. | |
| 2014/0187016 A1 | 7/2014 | Malhotra et al. | |
| 2014/0306575 A1* | 10/2014 | Paxton | H01J 45/00 310/306 |
| 2019/0027347 A1 | 1/2019 | Schwede et al. | |
| 2019/0196465 A1 | 6/2019 | Hummelshøj | |
| 2020/0119249 A1 | 4/2020 | Schwede et al. | |

FOREIGN PATENT DOCUMENTS

| | | |
|---|---|---|
| JP | 2011124412 A | 6/2011 |
| JP | 2012514856 A | 6/2012 |
| WO | 2010078521 A1 | 7/2010 |
| WO | 2018204470 A1 | 11/2018 |

OTHER PUBLICATIONS

Jared W. Schwede et al: "Photon-enhanced 1-15 thermionic emission for solar concentrator systems", Nature Materials, vol. 9, No. 9, Aug. 1, 2010 (Aug. 1, 2010).

Lucas R. Meza, "Strong, lightweight, and recoverable three-dimensional ceramic nanolattices", Sep. 12, 2014 • vol. 345 Issue 6202.

Martini, W. R. "Internal flame-heated thermionic converters." In Thermionic specialist conference, p. 356. 1963.

Riley, Daniel C., "Application of Semiconductors to Thermionic Energy Converters", A Dissertation Submitted to the Department of Physics and the Committee on Graduate Studies of Stanford University, Jun. 2015.

T. A. Schaedler, "Ultralight Metallic Microlattices", Nov. 18, 2011 vol. 334 Science www.sciencemag.org.

Varpula Aapo et al: "Diffusion-emission theory of photon enhanced thermionic emission solar energy harvesters" Journal of Applied Physics, American Institute F Physics, US, vol. 112, No. 4, Aug. 15, 2012 (Aug. 15, 2012), pp. 44506-4506, XP012166538.

Kim, J., et al., ""Kelvin probe and ultraviolet photoemission measurements of indium tin oxide work function: a comparison"", Synthetic Metals, vol. 111-112, pp. 311-314, Jun. 1, 2000; <URL: https://www.sciencedirect.com/science/articles/abs/pii/S0379677999003549>; abstract;section 2, p. 313; table1.

* cited by examiner

SYSTEM AND METHOD FOR THERMIONIC ENERGY CONVERSION

CROSS-REFERENCE TO RELATED APPLICATIONS

This application claims priority to U.S. Provisional Application No. 63/020,986, filed 6 May 2020, which is herein incorporated in its entirety by this reference.

This application is related to U.S. patent application Ser. No. 16/715,705, filed 16 Dec. 2019, and U.S. application Ser. No. 16/676,131, filed 6 Nov. 2019, each of which is herein incorporated in its entirety by this reference.

STATEMENT OF GOVERNMENT SUPPORT

This invention was made with government support under Contract Number W911NF-18-C-0057 awarded by the Defense Advanced Research Projects Agency. The government has certain rights in the invention.

TECHNICAL FIELD

This invention relates generally to the thermionic energy conversion field, and more specifically to a new and useful system and method in the thermionic energy conversion field.

BACKGROUND

Many typical thermionic energy converters (TECs) suffer from poor control of collector temperature and/or inter-electrode spacing. Further, management of work function reduction materials (e.g., cesium) can be challenging in such TECs. Thus, there is a need in the thermionic energy conversion field to create a new and useful system and method for thermionic energy conversion.

DESCRIPTION OF THE PREFERRED EMBODIMENTS

Figure 1:
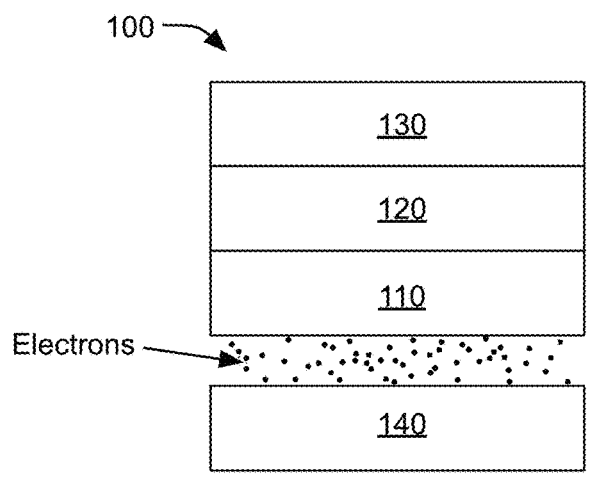
FIG. 1 is a schematic representation of an embodiment of a system for thermionic energy conversion.

The following description of the preferred embodiments of the invention is not intended to limit the invention to these preferred embodiments, but rather to enable any person skilled in the art to make and use this invention.

1. Benefits.

Variations of the technology can confer several benefits and/or advantages.

First, variants of the technology can ensure that the temperature of an electron collector remains at or near (e.g., within ±1° C., ±5° C., ±10° C., ±20° C., ±30° C., ±50° C., ±100° C., etc.) a target electron collector operation temperature. In specific examples, the interfacial layer can thermally couple (e.g., directly or indirectly) the electron collector to a cooling mechanism and/or other thermal control elements.

Second, variants of the technology can maintain a desired spacing (or spacing range) between an electron collector and an electron emitter (e.g., establishing an appropriate inter-electrode gap for efficient thermionic energy converter operation). For example, the interfacial layer can exert force on the electron collector to maintain the electron collector in an appropriate location relative to the electron emitter (e.g., pressing the electron collector against one or more spacer elements that function to maintain an inter-electrode gap). In some examples, the interfacial layer can be mechanically compliant, which can function to accommodate changing dimensions of one or more components (e.g., spacers, electron collectors, electron emitters, encapsulation, etc.), such as due to thermal expansion and/or contraction (e.g., as the system transitions to and/or from a system operation temperature, as temperatures of elements in the system vary during operation, etc.).

Third, variants of the technology can store (and/or release) work function reduction material (e.g., alkali and/or alkaline earth metals such as Cs, Ba, Sr, etc., and/or materials including such elements, such as oxides thereof, etc.). In specific examples, the work function reduction material can be included in the interfacial layer, which can remove the need for a separate reservoir for (and/or supply of) work function reduction material within the system.

Fourth, variants of the technology can control the location and/or quantity of work function reduction material within the system. In some thermionic energy converters, depending on the location, quantity, and/or concentration of work function reduction material, the work function reduction material can create unwanted electrical pathways within the system (e.g., parasitic shunts and/or shorts between the collector and emitter), react with components of the system, improperly modify the work function of the electron collector (e.g., due to insufficient or excess coating of the collector surface by the work function reduction material, which can lead to inadequate, or possibly excess, work function reduction), and/or can impact the system operation in any other manner. Variants of the technology can function to avoid or reduce one or more such problems through work function reduction material control. In specific examples, the structure, temperature, and/or temperature gradient of the interfacial layer (and/or other elements of the system) can localize the work function reduction material in the interfacial layer and/or otherwise control the location, quantity, and/or concentration of work function reduction material.

However, variants of the technology can confer any other suitable benefits and/or advantages.

2. System.

As shown by way of example in FIG. 1, a thermionic energy conversion system 100 can include one or more electron collectors 110, interfacial layers 120, encapsulation 130, and/or electron emitters 140. However, the system can additionally or alternatively include any other suitable elements.

In some examples, the system can include one or more elements such as described in U.S. patent application Ser. No. 16/883,762, filed 26 May 2020 and titled "SYSTEM AND METHOD FOR THERMIONIC ENERGY CONVERSION", which is herein incorporated in its entirety by this reference (e.g., wherein the 'emitter module 100' of U.S. patent application Ser. No. 16/883,762 includes the electron emitter(s); wherein the 'collector module 200' of U.S. patent application Ser. No. 16/883,762 includes the electron collector(s) and/or interfacial layer(s); wherein one or more of the 'emitter module 100', 'collector module 200', and/or 'seal 300' include one or more elements of the encapsulation; etc.). For example, the system 100 can include an emitter module (e.g., analogous to the 'emitter module 100' described in U.S. patent application Ser. No. 16/883,762) that includes the electron emitter 140 and a first portion of the encapsulation 130; a collector module (e.g., analogous to the 'collector module 200' described in U.S. patent application Ser. No. 16/883,762) that includes the electron collector 110, the interfacial layer 120, and a second portion of the encapsulation 130; and/or a seal (e.g., analogous to the 'seal 300' described in U.S. patent application Ser. No. 16/883,762) that includes a third portion of the encapsulation 130. The system preferably functions to convert a heat input into an electrical energy output.

The electron collector (e.g., anode) preferably functions to collect electrons (e.g., electrons emitted from an electron emitter, such as thermionically emitted electrons). At least one broad face of the electron collector preferably opposes at least one broad face of the electron emitter across a gap (inter-electrode gap). The gap preferably defines a separation distance (inter-electrode spacing) between the electron collector and the electron emitter. In some examples, the inter-electrode spacing is preferably between 100 nm and 1 mm, but can alternatively be less than 100 nm or greater than 1 mm. The gap (e.g., average gap, minimum gap, etc.) is preferably greater than a threshold minimum width (e.g., 0.1, 0.2, 0.3, 0.5, 0.75, 1, 2, 3, 5, 7.5, 10, 20, 30, 50, 75, 100, 200, 500, 1000, 0.1-0.3, 0.3-1, 1-3, 3-10, 10-30, 30-100, 100-300, and/or 300-1000 µm, etc.), but can additionally or alternatively be less than 100 nm or have any other suitable width. The gap (e.g., average gap, minimum gap, etc.) is preferably less than a threshold maximum width (e.g., 1, 2, 3, 5, 7.5, 10, 20, 30, 50, 75, 100, 200, 500, 1000, 3000, 1-3, 3-10, 10-30, 30-100, 100-300, 300-1000, and/or 1000-3000 µm, etc.), but can additionally or alternatively be greater than 3 mm or have any other suitable width. For example, the gap can have a width in the range 0.2-20 mm (e.g., 1-10, 1-3, 3-6, 5-10, or 10-20 mm, etc.), but can additionally or alternatively be narrower (or can alternatively be absent or substantially absent). However, the gap width can additionally or alternatively be in the range 20-50 mm, 50-200 mm, or be greater than 200 mm.

The gap can be defined and/or maintained by spacers 150 (e.g., as described in U.S. patent application Ser. No. 16/676,131, filed 6 Nov. 2019 and titled "SYSTEM AND METHOD FOR THERMIONIC ENERGY CONVERSION", which is herein incorporated in its entirety by this reference). For example, the electron collector can be pressed (e.g., by an interfacial layer) against spacers arranged within (and maintaining) the inter-electrode gap between the collector and emitter. However, the gap can additionally or alternatively be maintained by pockets, by other mechanical fixtures, and/or in any other suitable manner.

The electron collector is preferably coupled (e.g., mechanically, electrically, thermally, chemically, etc.) to the interfacial layer. The electron collector is preferably coupled to the interfacial layer along at least one broad face that does not oppose the electron emitter, but the electron collector can be coupled to the interfacial layer along any suitable broad face(s). The electron collector is preferably electrically conductive and/or semiconducting. For example, the electron collector can include (e.g., be made of) one or more: metals (e.g., refractory metals and/or low work function metals, such as tungsten, molybdenum, platinum, nickel, nickel alloys, superalloys, stainless steel, niobium, iridium, tantalum, etc.; metals exhibiting low work function on their own; metals exhibiting low work function when exposed to a work function reduction environment, such as in a barium, strontium, and/or cesium environment, optionally including oxygen, etc.; etc.), semiconductors (e.g., n-type semiconductors; p-type semiconductors; collector materials such as described in U.S. patent application Ser. No. 16/715,705, filed 16 Dec. 2019 and titled "SYSTEM AND METHOD FOR WORK FUNCTION REDUCTION AND THERMIONIC ENERGY CONVERSION", and/or in U.S. application Ser. No. 16/676,131, filed 6 Nov. 2019 and titled "System and Method for Thermionic Energy Conversion", each of which is herein incorporated in its entirety by this reference; etc.), and/or any other suitable materials.

During operation of a typical thermionic energy converter, the temperature of the electron collector may increase (e.g., above an optimal working temperature, above a target operation temperature, above a collector material phase transition, etc.). The temperate increase may be caused by the heat transfer from the electron emitter (e.g., radiative, conductive, convective, combinations thereof, etc.), by receiving electrons from the electron emitter, by parasitic heat flux through the system, and/or in any manner. The electron collector generally achieves the highest efficiency below a threshold temperature (e.g., a threshold temperature below the electron emitter operation temperature). Accordingly, it can be beneficial to cool the electron collector to and/or maintain the electron collector at a target electron collector temperature or temperature range (e.g., during operation).

The electron collector preferably is coupled to and/or includes one or more work function reduction materials, which can function to reduce the collector work function. For example, a work function reduction material present within the system (e.g., retained within the interfacial layer and/or present as vapor within an enclosure of the system, such as described below in further detail) can deposit onto, reside on, and/or otherwise interact with a surface of the electron collector. The work function reduction material preferably includes one or more alkali metals and/or alkaline earth metals (and/or compounds thereof, such as oxides and/or fluorides), more preferably coating (e.g., as a monolayer or few monolayers) or partially coating (e.g., as a partial monolayer) one or more surfaces, such as the electron collector surface. However, the electron collector can additionally or alternatively include pnictogen fluorides (e.g., nitrogen fluorides such as nitrogen trifluoride, phosphorous fluorides, arsenic fluorides, antimony fluorides, bismuth fluorides, etc.) and/or any other suitable materials.

In specific examples, the electron collector can be and/or include an "electron collector" (or elements thereof) as described in U.S. patent application Ser. No. 16/676,131, filed 6 Nov. 2019 and titled "SYSTEM AND METHOD FOR THERMIONIC ENERGY CONVERSION", and/or an "anode" (or elements thereof) as described in U.S. patent application Ser. No. 16/715,705, filed 16 Dec. 2019 and titled "SYSTEM AND METHOD FOR WORK FUNCTION REDUCTION AND THERMIONIC ENERGY CONVERSION", each of which is herein incorporated in its entirety by this reference.

However, the system can additionally or alternatively include any other suitable electron collector.

The electron emitter preferably functions to emit electrons (e.g., when the electron emitter temperature exceeds a threshold temperature). The electrons are preferably emitted into the inter-electrode gap (e.g., electrons emitted from the surface of the emitter proximal the gap), but can additionally or alternatively be emitted in any suitable direction, from any suitable emitter surface, and/or to any suitable component(s). The electron emitter (i.e., cathode) preferably contains (e.g., is, consists essentially of, etc.) one or more metals, preferably refractory metals such as tungsten, tantalum, rhenium, ruthenium, molybdenum, nickel, chromium, one or more superalloys (e.g., Inconels, Hastelloys, Kanthals, etc.), niobium, platinum, rhodium, iridium, etc., but additionally or alternatively any other suitable metals. However, the electron emitter can additionally or alternatively include one or more semiconductor materials, insulating materials, and/or any other suitable materials.

The electron emitter may be coupled to and/or include a work function reduction material such as an alkali metal and/or alkaline earth metal coating (and/or an oxide and/or fluoride thereof), which can function to reduce the emitter work function and/or increasing the number and/or energy of electrons emitted from the emitter. The work function reduction material is preferably on (e.g., deposited only, resident on, effective to reduce the work function of, etc.) a surface of the emitter proximal the gap, but may additionally or alternatively diffuse into the emitter, and/or be otherwise included in the emitter. However, the electron emitter can additionally or alternatively include pnictogen fluorides (e.g., nitrogen fluorides such as nitrogen trifluoride, phosphorous fluorides, arsenic fluorides, antimony fluorides, bismuth fluorides, etc.) and/or any other suitable materials.

In specific examples, the electron emitter can include and/or be configured as an "emitter module" and or any suitable component thereof as described in U.S. patent application Ser. No. 16/676,131, filed 6 Nov. 2019 and titled "SYSTEM AND METHOD FOR THERMIONIC ENERGY CONVERSION", and/or a "cathode" as described in U.S. patent application Ser. No. 16/715,705, filed 16 Dec. 2019 and titled "SYSTEM AND METHOD FOR WORK FUNCTION REDUCTION AND THERMIONIC ENERGY CONVERSION", each of which is herein incorporated in its entirety by this reference.

Figure 3A:
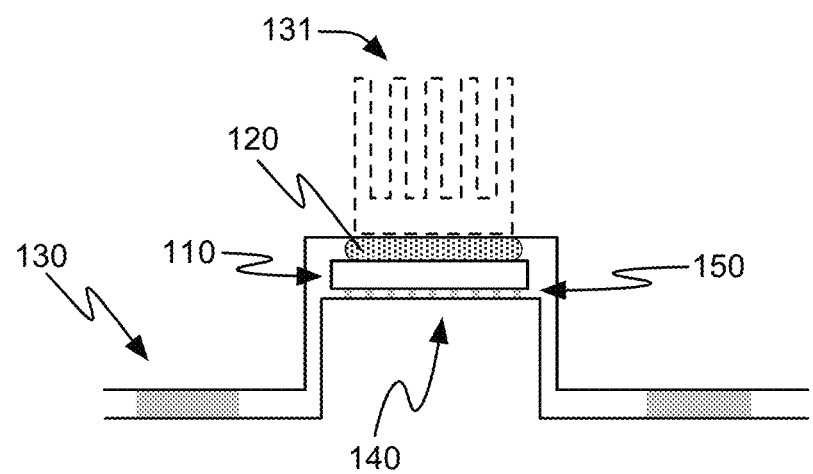
FIG. 3A is a schematic representation of an example of the system.
Figure 3B:
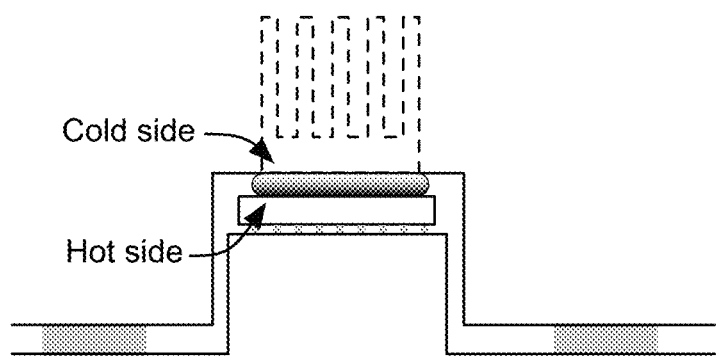
FIG. 3B is a schematic representation of an example of operation of the example of the system shown in FIG. 3A, with a thermal gradient across the interfacial layer.

The encapsulation preferably functions to isolate the system from an external environment proximal the system (e.g., surrounding the system). The encapsulation can additionally or alternatively function to dissipate energy from the electron collector, provide mechanical support to the electron collector and/or the system, and/or provide any other suitable function. The encapsulation can be coupled to the interfacial layer(s). The encapsulation is preferably arranged opposing the electron collector across the interfacial layer(s). For example, the encapsulation can be connected (e.g., mechanically, thermally, etc.) and/or otherwise coupled to the interfacial layer(s) on at least one broad face of the interfacial layer, preferably connected to a first broad face of the interfacial layer opposing a second broad face of the interfacial layer that is connected to the electron collector (e.g., as shown in FIGS. 3A-3B). However, the encapsulation can be coupled to the interfacial layer in any suitable manner.

The encapsulation preferably defines a chamber that surrounds the electron emitter, electron collector, and/or the interfacial layer. The chamber is preferably fluidly isolated from an ambient environment surrounding the system and/or the encapsulation (e.g., atmospheric air). The chamber environment is preferably at a reduced pressure (e.g., full or partial vacuum) compared to the ambient environment, but can be at the same pressure and/or an elevated pressure. The chamber can enclose one or more species (e.g., barium, cesium, oxygen, sodium, strontium, zirconium, etc.), such as species that can interact with one or more surfaces (e.g., emitter surface, collector surface, etc.) to modify (e.g., reduce) the work function of the surface(s). In some examples, one or more such species can be stored as fill materials (e.g., as described below in further detail), such as wherein the fill material generates a vapor pressure of the species within the chamber. In variants, such as wherein the one or more species are present in a fluid phase (e.g., gas), the pressure (and/or partial pressure) of each species (and/or of all such species together), such as during normal system operation, can be greater than a first threshold pressure (e.g., $1\times10^{-6}$, $2\times10^{-6}$, $5\times10^{-6}$, $1\times10^{-5}$, $2\times10^{-5}$, $5\times10^{-5}$, $1\times10^{-4}$, $2\times10^{-4}$, $5\times10^{-4}$, $1\times10^{-3}$, $2\times10^{-3}$, $5\times10^{-3}$, $1\times10^{-2}$, $2\times10^{-2}$, $5\times10^{-2}$, $1\times10^{-1}$, $2\times10^{-1}$, $5\times10^{-1}$, 1, 2, 5, 10, 20, 50, 100, 200, 500, 760, 800, $10^{-6}$-$10^{-2}$, $10^{-3}$-$10^{-1}$, 0.05-5, 0.75-15, and/or 5-100 Torr, greater than 800 Torr, less than $10^{-6}$ Torr, etc.), less than a second threshold pressure (e.g., $1\times10^{-6}$, $2\times10^{-6}$, $5\times10^{-6}$, $1\times10^{-5}$, $2\times10^{-5}$, $5\times10^{-5}$, $1\times10^{-4}$, $2\times10^{-4}$, $5\times10^{-4}$, $1\times10^{-3}$, $2\times10^{-3}$, $5\times10^{-3}$, $1\times10^{-2}$, $2\times10^{-2}$, $5\times10^{-2}$, $1\times10^{-1}$, $2\times10^{-1}$, $5\times10^{-1}$, 1, 2, 5, 10, 20, 50, 100, 200, 500, 760, 800, $10^{-6}$-$10^{-2}$, $10^{-3}$-$10^{-1}$, 0.05-5, 0.75-15, and/or 5-100 Torr, greater than 800 Torr, less than $10^{-6}$ Torr, etc.), and/or any suitable pressure (or partial pressure). In a specific example, during normal system operation, the system includes a vapor pressure of one or more species present in the fill material (e.g., cesium) between 0.1 and 10 Torr (e.g., 0.2-5, 0.5-2, and/or about 1 Torr, etc.). However, the chamber can additionally or alternatively have any other suitable properties.

In variants, the encapsulation can include one or more of: collector leads, emitter leads, cooling elements, seals, and/or other components as described in U.S. patent application Ser. No. 16/676,131, filed 6 Nov. 2019 and titled "SYSTEM AND METHOD FOR THERMIONIC ENERGY CONVERSION", which is herein incorporated in its entirety by this reference. However, the encapsulation can include and/or be arranged in any suitable manner.

The seal preferably functions to mechanically (but preferably not electrically) couple the electron emitter to the electron collector (and/or encapsulation, interfacial layer, or other components). The seal can additionally or alternatively function to isolate the chamber environment from an ambient environment (e.g., in cooperation with other portions of the encapsulation). The seal preferably includes one or more electrical insulator materials, more preferably materials that can withstand (e.g., without melting, deforming, decomposing, and/or chemically reacting with other species present in the chamber environment, etc.) the seal temperature during TEC operation. The materials are preferably glass and/or ceramic (e.g., bulk ceramic, deposited ceramic, etc.; crystalline and/or amorphous ceramics). For example, the seal can include one or more boride, carbide, oxide, and/or nitride materials and/or any other suitable materials. In specific examples, the seal includes one or more of alumina (e.g., sapphire, amorphous alumina, etc.), aluminum nitride, silica, silicate glass, silicon, silicon carbide, silicon nitride, and/or any other suitable materials. However, the seal can additionally or alternatively include any other suitable materials.

The encapsulation preferably includes (and/or is thermally coupled to) one or more cooling elements 131, which can function to facilitate heat removal from the electron collector (and/or any other suitable elements of the system). The heat removal is preferably achieved convectively (e.g., in cooperation with an airflow module, in cooperation with a cooling fluid, etc.), but can additionally or alternatively include radiative heat removal, conductive heat removal, and/or heat removal by any other suitable mechanism(s). The cooling element preferably maintains the electron collector and/or interfacial layer at or below a target temperature (e.g., a target temperature in the range 0-100, 100-200, 200-400, 400-600, 200-275, 250-350, 325-400, and/or 275-325° C., such as 300° C.), such as between the target temperature and a lower temperature (e.g., ambient environment temperature ("room temperature"), 0, 10, 20, 25, 30, 50, 75, 100, 150, 200, 250, 0-25, 25-50, 50-100, 100-200, and/or 200-300° C., etc.), during operation. The cooling element is preferably thermally coupled to the electron collector (e.g., by the interfacial layer). In some examples, the cooling element includes one or more surface modifiers, preferably including (e.g., made of) metal, which can function to induce turbulence (e.g., in a heat transfer fluid, such as air, water, glycerol, etc.) and/or otherwise increase fluid interaction (e.g., heat transfer) with the cooling element. Such surface modifiers can include fins (e.g., parallel plates), baffles, ribs, dimples, and/or any other suitable structures.

The cooling elements can include passive cooling element(s) (e.g., a heat sink, a heat spreader, heat pipe, etc.) and/or active cooling element(s) (e.g., forced air, forced liquid, thermoelectric cooler, etc.). In some examples, the system can include one or more temperature control elements (e.g., including cooling elements) such as described in U.S. patent application Ser. No. 16/883,762, filed 26 May 2020 and titled "SYSTEM AND METHOD FOR THERMIONIC ENERGY CONVERSION", which is herein incorporated in its entirety by this reference (e.g., elements of one or more 'airflow modules 13' such as described in U.S. patent application Ser. No. 16/883,762).

Figure 4:
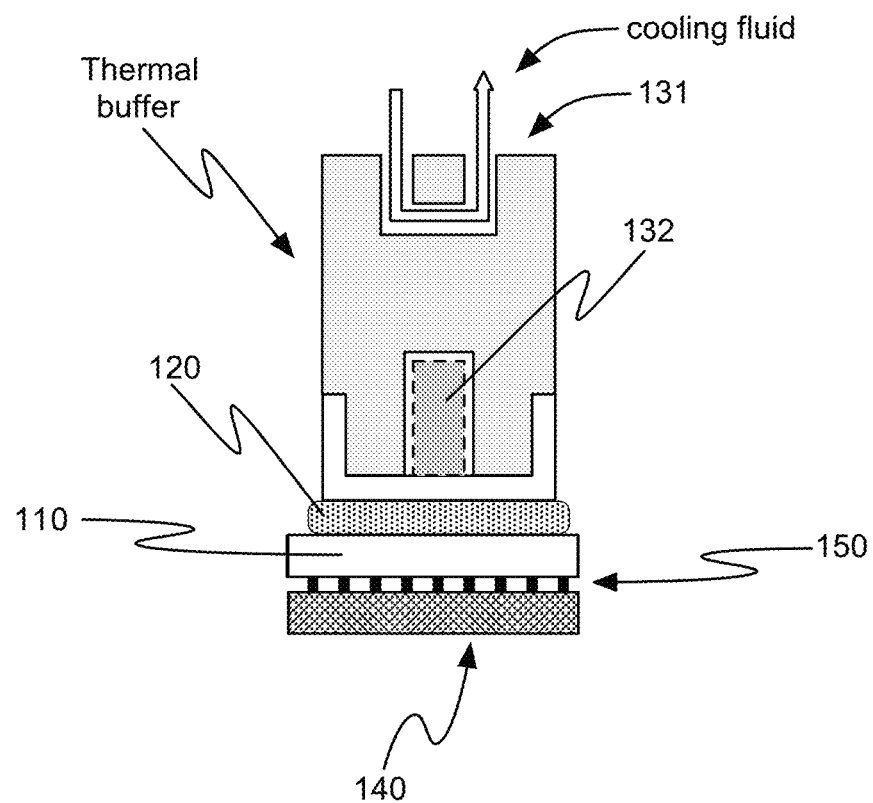
FIG. 4 is a schematic representation of an example of the system.

As shown by way of examples in FIGS. 3A, 3B, and 4, the cooling element is preferably arranged proximal the interfacial layer (and/or electron collector) and/or otherwise configured to prioritize cooling of the interfacial layer and/or electron collector (e.g., more than other elements of the system). Such an arrangement can provide benefits over alternative arrangements, such as wherein the cooling element is arranged proximal and/or prioritizes cooling of other elements of the system. Such other elements can include the seal, elements arranged at and/or near the heating cavity opening, and/or any other suitable elements. For example, this arrangement can (e.g., during thermionic energy converter operation) enable maintenance of the interfacial layer at a lower temperature than in other arrangements, such as a temperature below a threshold temperature such as 450, 400, 350, 300, 250, 200, 150, 100, 50, 50-150, 100-200, 150-250, 200-300, and/or 300-450° C. or any other suitable temperature (and, in some examples, above a second threshold temperature such as 400, 350, 300, 250, 200, 150, 100, 50, 0, 0-100, 50-150, 100-200, 150-250, 200-300, and/or 300-400° C.), resulting in a greater possible device efficiency and/or greater work function reduction material localization proximal to (e.g., within) the interfacial layer.

However, the cooling element can additionally or alternatively include any other suitable elements with any suitable arrangement.

In some examples, the encapsulation can include (and/or be thermally coupled to) one or more heating elements 132. For example, the encapsulation can include a heating element arranged proximal the interfacial layer(s) relative to a cooling element (e.g., as shown in FIG. 4). However, the encapsulation can additionally or alternatively include a cooling element arranged proximal the interfacial layer(s) relative to a heating element, and/or can include any other suitable arrangement of heating and cooling elements. The heating elements (preferably in cooperation with one or more cooling elements) can function to enable and/or improve temperature control of other elements of the system, such as the interfacial layer (e.g., thereby enabling greater control over a fill material contained within the interfacial layer, such as control over the vaporization of liquid cesium stored in the interfacial layer). For example, by varying heat output by the heating element, the temperature of the interfacial layer can be controlled (e.g., enabling maintenance of the interfacial layer temperature within a desired temperature range for efficient system operation, such as a temperature range with a minimum and maximum each within the range 100-300° C. and/or each 0-200° C. less than the electron collector temperature). However, the system can additionally or alternatively include any other suitable heating elements having any other suitable functionality (and/or can include no heating elements).

The interfacial layer preferably functions to couple (e.g., thermally, electrically, mechanically, and/or chemically, etc.) the electron collector to the encapsulation (and/or any suitable components of the encapsulation and/or an external system such as an external load). At least one broad face of the interfacial layer is preferably in contact with (e.g., touching, mechanically connected to, etc.) the electron collector, and at least one broad face is preferably in contact with the encapsulation. At least one broad face in contact with the electron collector is preferably distinct from at least one broad face in contact with the encapsulation (e.g., wherein the two broad faces oppose each other across the interfacial layer), but the same broad face(s) can be in contact with the electron collector and the encapsulation. The interfacial layer can be in point contact (e.g., one or more discrete points), edge contact, surface contact, volumetric contact, and/or any suitable contact. In some embodiments, the interfacial layer can include (and/or function as) a "collector bridge" as described in U.S. patent application Ser. No. 16/676,131, filed 6 Nov. 2019 and titled "SYSTEM AND METHOD FOR THERMIONIC ENERGY CONVERSION", which is herein incorporated in its entirety by this reference. The interfacial layer is preferably in fluid communication (e.g., fluid contact) with the chamber environment (e.g., and thus fluidly coupled to the inter-electrode gap).

In specific examples, the interfacial layer can be adhered to (e.g., using adhesive(s); using adhesive forces such as surface tension, wetting, etc. generated by the work function reduction material, fill material, etc.; etc.), be fabricated on (e.g., grown and/or deposited on, defined into such as by etching, etc.), be integrated into (e.g., partial and/or complete intercalation), be mounted and/or fastened to, be welded to, be mated to (e.g., include structural retention features on the interfacial layer and/or the other mated component(s), such as complementary male portions and female portions, threaded portions, etc.), be mechanically interlocked to, be electrostatically and/or magnetically coupled to, be contacted without or substantially without a coupling force and/or mechanism, and/or otherwise be in contact with the collector and/or encapsulation. However, the interfacial layer (and/or a separate interfacial layer) can be in contact with any suitable component(s) and arranged in any manner.

The interfacial layer is preferably compliant (e.g., deformable). Such compliance can function to accommodate mechanical changes (e.g., thermal expansion and/or contraction; deformation in response to forces, such as forces arising from pressure differentials; etc.) of one or more system components, preferably without (or substantially without) degrading the system operation and/or function. The interfacial layer is preferably elastically deformable, but can additionally or alternatively be inelastically deformable, anelastically deformable, and/or have any suitable deformation. The interfacial layer can expand and/or contract. As the interfacial layer expands and/or contracts the separation distance (and/or orientation) between the electron collector and electron emitter preferably remains substantially constant (e.g., does not change; does not change substantially; changes by less than a threshold amount such as 1%, 2%, 5%, 10%, 20%, 0.1-1%, 1-2%, 2-5%, 5-10%, 10-20%, 20-30%, etc., and by more than 0%), but can alternatively change substantially (e.g., wherein the separation distance and/or orientation can be reached when the interfacial layer reaches an operation temperature), such as changing by, or by more than, a threshold amount (e.g., 1%, 2%, 5%, 10%, 20%, 0.1-1%, 1-2%, 2-5%, 5-10%, 10-20%, 20-30%, etc.). The spring constant of the interfacial layer (e.g., modelling the interfacial layer as a Hookean spring) is preferably between about 10-500 kN/m, such as 25, 50, 75, 100, 150, 200, 250, 300, 400, 10-50, 50-100, 100-200, and/or 200-500 kN/m, but can be less than 10 kN/m, greater than 500 kN/m, and/or have any other suitable value. In some examples, the interfacial layer can include (e.g., be made of) one or more springs (e.g., cantilever springs, coil springs, etc.), such as micromachined and/or nanofabricated springs. However, the interfacial material can additionally or alternatively include any other suitable elements configured to achieve the desired compliance.

The interfacial layer preferably includes (e.g., is made of, is composed of, etc.) one or more interfacial materials. The interfacial material is preferably compatible with (e.g., does not react with, reacts with at a rate less than a threshold reaction rate, does not diffuse into, has a diffusion coefficient (and/or interdiffusion coefficient) less than a threshold diffusion coefficient, etc.) one or more electron collector materials (e.g., semiconductor, such as group IV semiconductors, such as Si, Ge, SiC, and/or alloys thereof; III-V semiconductors, such as GaAs, GaSb, GaP, GaN, AlSb, AlAs, AlP, AlN, InSb, InAs, InP, InN, and/or alloys thereof; II-VI semiconductors, such as ZnTe, ZnSe, ZnS, ZnO, CdSe, CdTe, CdS, MgSe, MgTe, MgS, and/or alloys thereof; etc.). In a specific example, the interfacial material has low a diffusion coefficient (e.g., at 0° C., 100° C., 200° C., 300° C., 400° C., 500° C., etc.; at an electron collector operation temperature; at an interfacial layer temperature; at an encapsulation temperature; etc.) into the collector material(s), such as a diffusion coefficient (and/or interdiffusion coefficient) less than about $1\times10^{-9}$ cm$^2$/s, such as less than $1\times10^{-15}$, $1\times10^{-15}$, $2\times10^{-15}$, $5\times10^{-15}$, $1\times10^{-14}$, $2\times10^{-14}$, $5\times10^{-14}$, $1\times10^{-13}$, $2\times10^{-13}$, $5\times10^{-13}$, $1\times10^{-12}$, $2\times10^{-12}$, $5\times10^{-12}$, $1\times10^{-11}$, $2\times10^{-11}$, $5\times10^{-11}$, $1\times10^{-10}$, $2\times10^{-10}$, $5\times10^{-10}$, etc. However, the interfacial material (e.g., at 0° C., 100° C., 200° C., 300° C., 400° C., 500° C., etc.; at an electron collector operation temperature; at an interfacial layer temperature; at an encapsulation temperature; etc.) can have a diffusion coefficient (and/or interdiffusion coefficient) into the collector material that is greater than about $1\times10^{-9}$ and/or any suitable diffusion coefficient. The interfacial material can include one or more: metals (e.g., nickel, tantalum, zirconium, titanium, tungsten, molybdenum, rhenium, hafnium, iron, copper, etc.), work function reduction material precursors, alloys (e.g., tungsten-rhenium, tungsten-rhenium-hafnium carbide, inconel, hastelloy, incoloy, monel, nimonic, stellite, cupronickel, steels, stainless steels, etc.), carbonaceous materials (e.g., graphite), and/or any suitable material(s). The work function reduction material precursors are preferably oxides (e.g., chromates, dichromates, oxides, superoxides, peroxides, aluminates, silicates, borates, titanates, vanadates, vanadites, ferrates, permanganates, manganates, etc.) of the work function reduction material. However, the work function reduction material precursors can additionally or alternatively include sulfides, nitrides, azides, halides, and/or any suitable anionic salt of the work function reduction material, and/or any other suitable precursors.

In one example, in which the interfacial layer includes a metal (such as titanium, hafnium, zirconium, iron, nickel, aluminum, calcium, magnesium, beryllium, strontium, barium, radium, etc.) and work function reduction material precursors, the metal can react with the work function reduction material precursor (e.g., once the interfacial layer reaches a reaction temperature, at specific chamber pressures such as those achieved during normal operation of the TEC, etc.), releasing work function reduction material.

In a specific example, the interfacial layer can include a sacrificial metal (e.g., titanium, hafnium, zirconium, iron, nickel, aluminum, calcium, magnesium, beryllium, strontium, barium, radium, etc.) and a work function reduction material precursor (e.g., cesium chromate ($Cs_2CrO_4$)). The sacrificial metal can be included as a structural component, as a coating, in a sacrificial metal reservoir, as a nonstructural component, and/or otherwise included in the interfacial layer. When the interfacial layer reaches a threshold temperature (e.g., room temperature, a target operation temperature, a reaction temperature, etc.), some of the sacrificial metal, denoted as 'M', can react with the $Cs_2CrO_4$ to produce Cs and $M_2(CrO_4)_x$.

In some variants, the interfacial layer can be (partially and/or entirely) coated. The coating(s) can function to modify the electrical, thermal, mechanical, chemical, and/or other properties of the interfacial layer and/or interfacial material (and/or of its interface(s) with other elements of the system). For example, the coating(s) can function to improve thermal and/or electrical conduction between the interfacial layer and the element(s) it contacts (e.g., the collector and/or encapsulation). The coatings can be the same or different from the interfacial materials (e.g., can include one or more of the interfacial materials, can include different materials than the interfacial materials, such as materials described above regarding the interfacial materials, etc.). The coatings can be deposited, grown, plated (e.g., electroplating), dip-coated, spray-coated, roll-coated, and/or the interfacial material can be otherwise coated. In a first specific example, in which the interfacial material includes tungsten and/or cobalt, the coating can include copper. In a second specific example, in which the interfacial material includes copper, the coating can include nickel. However, any suitable coating can be used for any interfacial material.

The interfacial layer can additionally or alternatively function to store one or more fill materials (e.g., function as a reservoir for fill material(s)). The fill material is preferably a fluid (e.g., liquid, gas, supercritical fluid, etc.), more preferably a condensed phase such as a liquid, but can additionally or alternatively include solids, plasmas, and/or any other phases of matter. In some embodiments, the fill material can modify (e.g., determine, increase, decrease, etc.) the physical and/or chemical properties of the interfacial layer (such as the thermal conductivity, electrical conductivity, deformability, spring constant, diffusivity, etc.). For example, the fill material can function to increase coupling (e.g., thermal, electrical, etc.) between the collector and the encapsulation. The fill material preferably partially or fully wets the interfacial layer, but can alternatively be nonwetting to the interfacial layer. The wettability of the fill material to the interfacial layer can be controlled based on the structure (e.g., nanoscopic structure, mesoscopic structure, macroscopic structure, etc.) of the interfacial layer, the interfacial material, the fill material, the surface energy of the interfacial layer, the surface treatment of the interfacial layer, and/or any suitable properties of the interfacial layer.

The fill material is preferably a work function reduction material (e.g., alkali and/or alkaline earth metal, such as cesium, barium, strontium, etc.), such as wherein the interfacial layer functions as an integral reservoir for the work function reduction material (e.g., integral cesium reservoir). However, the fill material(s) can additionally or alternatively include material(s) corresponding to one or more "anode layers" (preferably a work function tuning layer, but additionally or alternatively any other suitable anode layer(s), e.g., semiconductor layer, electronic protection layers, electron capture layers, chemical protection layers, etc.) as described in U.S. patent application Ser. No. 16/676,131, filed 6 Nov. 2019 and titled "SYSTEM AND METHOD FOR THERMIONIC ENERGY CONVERSION", which is herein incorporated in its entirety by this reference.

The geometry of (e.g., the three dimensional structure bounding, defining, enclosing, etc.) the interfacial layer can be and/or include one or more structures such as: a prismatoid (e.g., a rectangular prism), frustopyramidal, frustoconical, cylindrical, arbitrary, and/or have any suitable geometry. The broad face(s) of the interfacial layer in contact with the electron collector preferably have approximately the same shape as the broad face(s) of the electron collector that they are in contact with, but can have a different shape from the broad face(s) of the electron collector. The broad face(s) of the interfacial layer in contact with the electron collector preferably have substantially the same size (e.g., lateral and/or longitudinal extent differ by at most 1%, 5%, 10%, 20%, 30%, 40%, etc.) as the broad face(s) of the electron collector that they are in contact with, but can have a different size (e.g., larger or smaller than) from the broad face(s) of the electron collector.

The thickness of the interfacial layer can be selected based on the physical and/or chemical properties of the interfacial layer (e.g., during system operation under normal conditions, such as at elevated temperature and/or in the presence of cesium). For example, a thin interfacial layer (e.g., thinner than a first threshold thickness) can exhibit nonlinear (e.g., inelastic) mechanical properties, whereas a thick interfacial layer (e.g., thicker than a second threshold thickness) may require large volumes of fill material (e.g., to achieve a desired state, such as complete or substantially complete loading with fill material, fill material loading within a threshold fraction of maximum capacity, such as 50%, 75%, 85%, 90%, 95%, 98%, 30-60%, 50-100%, 50-80%, 70-85%, 80-90%, 90-95%, and/or 95-100%, etc.), can exhibit large thermal gradients and/or temperature differences (e.g., greater than a threshold gradient or temperature difference), can undergo large expansions and/or contractions with temperature changes, and/or can otherwise be unfavorable. Accordingly, the thickness is preferably selected to avoid and/or balance such potential detriments. The thickness of the interfacial layer is preferably between 0.05-10 mm, such as 0.1 mm, 0.2 mm, 0.3 mm, 0.5 mm, 0.75 mm, 1 mm, 1.25 mm, 1.5 mm, 2 mm, 3 mm, 4 mm, 5 mm, 7.5 mm, 9 mm, 0.05-0.5 mm, 0.1-1 mm, 0.5-10 mm. However, the thickness of the interfacial layer can be less than 0.05 mm, greater than 10 mm, and/or any other suitable thickness.

Figure 2A:
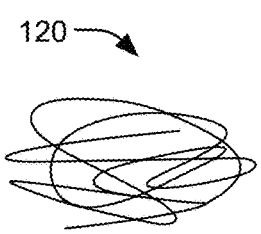
FIGS. 2A-2G are representations of various examples of interfacial layers.
Figure 2B:
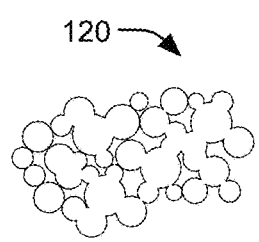
Figure 2C:
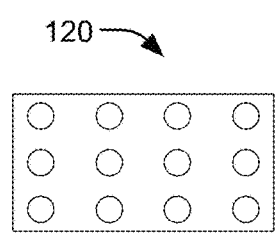
Figure 2D:
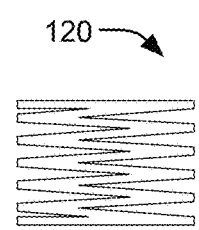
Figure 2E:
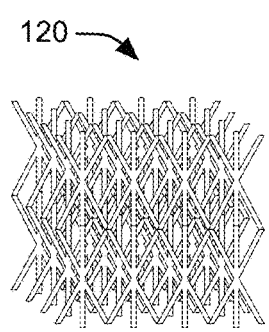
Figure 2F:
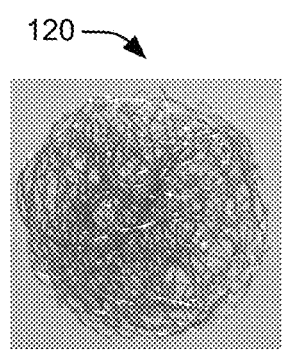
Figure 2G:
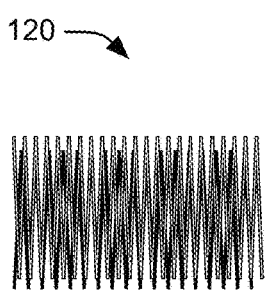

The interfacial layer preferably defines an open volume, but can alternatively be a solid material (e.g., not defining open volumes such as pores and/or cavities). In specific examples, the interfacial layer can include porous elements (e.g., defining nanopores, micropores, mesopores, macropores, etc., such as shown by way of example in FIG. 2B), aligned, unaligned, and/or partially aligned bundles of filaments (e.g., as shown in FIG. 2A), balls of wire (e.g., nickel wire, etc.) such as shown by way of example in FIG. 2F, aligned, unaligned, and/or partially aligned fibers and/or bristles (e.g., as shown in FIG. 2G), structures (e.g., holes, dimples, troughs, valleys, cavities, raised structures, meshes, etc.; as shown in FIGS. 2C and 2D; etc.), an array of structures (e.g., as shown in FIG. 2E; structures such as those described, for example, in Meza, Lucas R., Satyajit Das, and Julia R. Greer. "Strong, lightweight, and recoverable three-dimensional ceramic nanolattices." *Science* 345.6202 (2014): 1322-1326 and/or Schaedler, Tobias A., et al. "Ultralight metallic microlattices." *Science* 334.6058 (2011): 962-965, each of which is herein incorporated in its entirety by this reference; etc.), metal wool (e.g., steel wool, copper wool, etc.), felts (e.g., graphite felt), layered sheets of materials (e.g., corrugated and/or crinkled sheets, etc.), nano- and/or microfabricated structures (e.g., structures prepared using: atomic layer deposition, such as mechanically-compliant structures fabricated via atomic layer deposition; chemical vapor deposition; physical vapor deposition; sputtering; etching; combinations thereof; etc.), and/or have any suitable structure.

The fill fraction (e.g., porosity, such as the percentage of the total volume of the interfacial layer that is open volume, that is filled or possible to be filled with one or more fill materials, etc.) can be selected based on the interfacial material(s), the fill material(s), the operation parameters (e.g., electrical parameters such as voltage, current, power, etc.; operation temperature such as electron collector temperature, interfacial layer temperature, electron emitter temperature, etc.; operation pressure; etc.), the size of the interfacial layer and/or the electron collector, and/or any suitable properties. For example, an interfacial layer with a low fill fraction (e.g., lower than a first threshold fill fraction) can become inelastic; whereas an interfacial layer with a high fill fraction (e.g., higher than a second threshold fill fraction) can have low conductivity (e.g., thermal conductivity, electrical conductivity, etc.), such as conductivity of the filled and/or unfilled interfacial layer, and/or can exhibit poor fill material retention (e.g., wherein a large portion of the fill material can leave the interfacial layer, such as by evaporation, which may leave the interfacial layer unfilled, substantially unfilled, or filled less than a minimum desired fill state for efficient operation). However, in some embodiments, the fill fraction can have little (e.g., less than 1%, 2%, 5%, 10%, 20%, etc.) or no impact on the interfacial layer properties (e.g., physical and/or chemical properties), the interfacial layer can be chosen and/or designed to work for any fill factor (e.g., one interfacial layer that works for any fill factor, different interfacial layers designed for different fill factors, etc.), and/or any fill factor can be used.

The fill factor is preferably between about 75-99.5% such as 99.4, 99.3, 990.2, 99.1, 99, 98, 96, 94, 92, 90, 87.5, 85, 82.5, 80, 77.5, 99-99.5, 98-99, 95-98, 90-96, 85-90, 80-85, and/or 75-80%, etc. However, the fill factor can be less than 75%, greater than 99.5%, and/or any suitable fraction.

However, the system can additionally and/or alternatively include one or more reservoirs (e.g., of work function reduction material and/or any other suitable fill materials) separate from the interfacial layer.

The interfacial layer can additionally or alternatively function to conduct heat (e.g., operate as a thermal interface layer). During operation, the interfacial layer preferably conducts heat away from the electron collector (e.g., functions to cool the electron collector), more preferably from the collector to the encapsulation (e.g., to the cooling mechanism). However, the interfacial layer can additionally or alternatively can conduct heat to the electron collector (e.g., warm the electron collector to a working temperature, operate in a feedback loop to maintain electron collector temperature within a desired temperature range, etc.).

The thermal conductivity of the interfacial layer can depend on the interfacial layer geometry (e.g., unloaded interfacial layer, as-manufactured interfacial layer, loaded interfacial layer, during normal operation, etc.), interfacial layer material, interfacial layer loading (e.g., fill material, fill factor, etc.), and/or any property(ies) of the interfacial layer. The thermal conductivity can be isotropic (e.g., the same in the x/y/z directions) and/or anisotropic (e.g., different in x/y/z directions). The thermal conductivity of the interfacial layer is preferably at least about 0.5 W/(m*K) such as 0.75, 1, 2, 3, 5, 10, 20, 50, 100, 200, 500, 1000, 2000, 5000, 5-20, 1-10, 10-50, and/or 25-200, W/(m*K), etc. However, the thermal conductivity of the interfacial layer can be less than 0.5 W/(m*K).

In some variants, the interfacial layer can be configured to use the Leidenfrost effect to modify and/or impart thermal properties of the interfacial layer. The Leidenfrost effect is the phenomenon where a liquid close to a hot surface (e.g., a surface at a temperature and pressure above the Leidenfrost point for the liquid) rapidly evaporates producing a layer of vapor that insulates (e.g., thermally insulates) the unevaporated liquid from the surface thereby slowing the rate of evaporation for the unevaporated liquid (e.g., relative to if the liquid were in direct contact with the surface). In a specific example, the work function reduction material can be a liquid and can leverage the Leidenfrost effect when in contact with the electron collector (and/or the encapsulation). However any suitable material(s) and/or interfacial layers can be used to enable the Leidenfrost effect.

In other variants, the interfacial layer can be configured to be agnostic to and/or suppress the Leidenfrost effect. In a specific example, the geometry, surface energy, wettability (e.g., of the interfacial layer to the work function reduction material), interfacial material, and/or any suitable property(ies) can be chosen to wick work function reduction material, which can function to suppress droplet formation thereby interrupting the Leidenfrost effect.

In other variants, the interfacial layer can be configured to operate as a heat pipe (e.g., can include one or more heat pipes). In a specific example of these variants, the work function reduction material can be used as the working fluid (e.g., material that is evaporated and condensed within the heat pipe) of a heat pipe to transfer heat between the electron collector and the encapsulation (and/or an interfacial layer). However, any suitable fill material can be used as heat pipe working material and/or the heat pipe can be otherwise arranged.

However, the interfacial layer can be configured to enable the Leidenfrost effect (e.g., in a first mode, in a first set of operation conditions, for specific materials, etc.) and to be agnostic to and/or suppress the Leidenfrost effect (e.g., in a second mode, in a second set of operation conditions, for specific materials, etc.), and/or be otherwise configured.

As shown in FIG. 3B, there may be a thermal gradient across the interfacial layer (e.g., during operation, such as operation under normal conditions, desired conditions, maximally-efficient conditions, etc.). The gradient is preferably defined along (or substantially along) an axis between the electron collector and the encapsulation (e.g., the interfacial layer can be hotter on a side and/or broad face of the interfacial layer proximal the electron collector and colder on a side and/or broad face proximal the encapsulation or vice versa). However, the gradient can be along an axis perpendicular to or oblique to the axis between the electron collector and the encapsulation, can be a radial temperature gradient, an azimuthal temperature gradient, and/or any suitable temperature gradient. The largest temperature difference ($\Delta T$) within the interfacial layer (e.g., between a hottest location and a coldest location, such as surfaces, points, volumes, etc., of the interfacial layer; preferably between a hottest location at or near the collector and a coldest location at or near the encapsulation) is preferably at most 200° C. (e.g., $\Delta T$ is less than or equal to about 1, 2, 5, 10, 20, 50, 100, 150, 175, 190, and/or 200° C., etc.; $\Delta T$ is within the range 0-200, 0-10, 10-30, 20-50, 30-100, 50-150, and/or 100-200° C.), but can alternatively be greater than 200° C. The smallest $\Delta T$ within the interfacial layer (e.g., between a hottest location and a coldest location, such as surfaces, points, volumes, etc., of the interfacial layer; preferably between a hottest location at or near the collector and a coldest location at or near the encapsulation) is preferably greater than a threshold temperature difference (e.g., $\Delta T$ is greater than or equal to about 1, 2, 5, 10, 20, 50, 100, 150, 175, 190, and/or 200° C., etc.; $\Delta T$ is within the range 1-200, 1-10, 10-30, 20-50, 30-100, 50-150, and/or 100-200° C., etc.), but can alternatively be less than 1° C. The temperature difference can function to localize the work function reduction material within the interfacial layer (e.g., promote work function reduction material condensation and/or collection in the interfacial layer, as opposed to at other components within the chamber).

The coldest (or substantially coldest) location within the chamber (e.g., during system operation under normal conditions) is preferably located within the interfacial layer (e.g., at least a portion of the interfacial layer is at a lower temperature than the electron collector, electron emitter, spacers, etc.), which can function to preferentially condense and/or localize work function reduction material (and/or any suitable material(s)) within the interfacial layer. However, the interfacial layer (or a subset thereof) can alternatively be (e.g., during system operation under normal conditions) within a threshold temperature difference of the coldest temperature within the chamber (e.g., exceeding the coldest chamber temperature by 0-50, 0-10, 10-30, and/or 20-50° C.), or can have any other suitable temperature.

In some variants, thermal transport across the interfacial layer can be provided by and/or enhanced by the presence of fill material within the interfacial layer. For example, fill material can provide enhanced thermal conduction, and/or a fluid (e.g., liquid) fill material can mediate heat transfer via convection. In a specific example (e.g., in which the fill material is or includes a liquid metal, such as liquid cesium), both convection and conduction within the fill material may contribute significantly to thermal transport across the interfacial layer.

The interfacial layer can additionally or alternatively function to provide electrical conductivity (e.g., conduct electrons out of and/or into the electron collector). Electrical current can be conducted between the electron collector and (e.g., electrons can be conducted from the electron collector to) an external load, the encapsulation, and/or to any suitable endpoint. The electrical conductivity (e.g., electron conductivity) of the interfacial layer can depend on the interfacial layer geometry (e.g., unloaded interfacial layer, as manufactured interfacial layer, etc.), interfacial layer material, interfacial layer loading (e.g., fill material, fill factor, etc.), and/or any property(ies) of the interfacial layer. The electrical conductivity (e.g., electron conductivity) can be isotropic (e.g., the same in the x/y/z directions) and/or anisotropic (e.g., different in x/y/z directions).

In a specific example, the electrical conductivity (e.g., electron conduction) of the interfacial layer can be greater than about $1 \times 10^4$ S/m (e.g., greater than about $10^5$ S/m, $10^6$ S/m, $10^7$ S/m, etc.). However, the electrical conductivity of the interfacial layer can be less than $10^4$ S/m and/or have any suitable value.

In some variants, the presence of fill material within the interfacial layer can provide and/or enhance the electrical conductivity (e.g., electron conductivity) of the interfacial layer, can reduce the contact resistance between the interfacial layer and the electron collector (and/or encapsulation), and/or otherwise modify the electrical properties of the interfacial layer.

Figure 5:
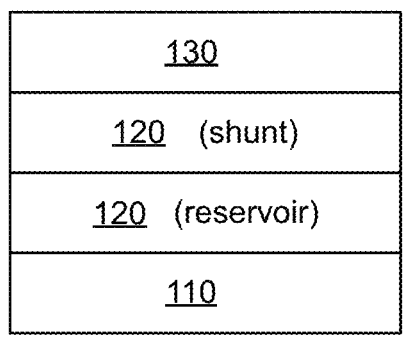
FIG. 5 is a schematic representation of an example of the system that includes a porous interface material and a shunt.

In some variants, the system can include more than one interfacial layer. Each interfacial layer is preferably different (e.g., different geometries, different surface energies, different interfacial materials, different fill materials, etc.), but can be the same. Additional interfacial layers can modify the electrical thermal, mechanical, chemical and/or any suitable coupling between any components (e.g., between the electron emitter and the encapsulation, between the electron collector and the encapsulation, between a first interfacial layer and the encapsulation, between the electron collector and a first interfacial layer, etc.). In a specific example (e.g., as shown in FIG. 5), the system can include a porous interfacial layer (e.g., work function reduction material reservoir) and a solid interfacial layer (e.g., shunt). The shunt can function to offset the interfacial layer (and electron collector) from the encapsulation (e.g., the cooling mechanism), which can modify the operation temperature and/or thermal gradient of the work function reduction material reservoir. In this example, the shunt can be arranged between the work function reduction material reservoir and the encapsulation. In variants, the inclusion of a shunt can be particularly beneficial for Cs plasma thermionic energy converters, but can be used for any thermionic energy converters and/or any suitable system.

Figure 6A:
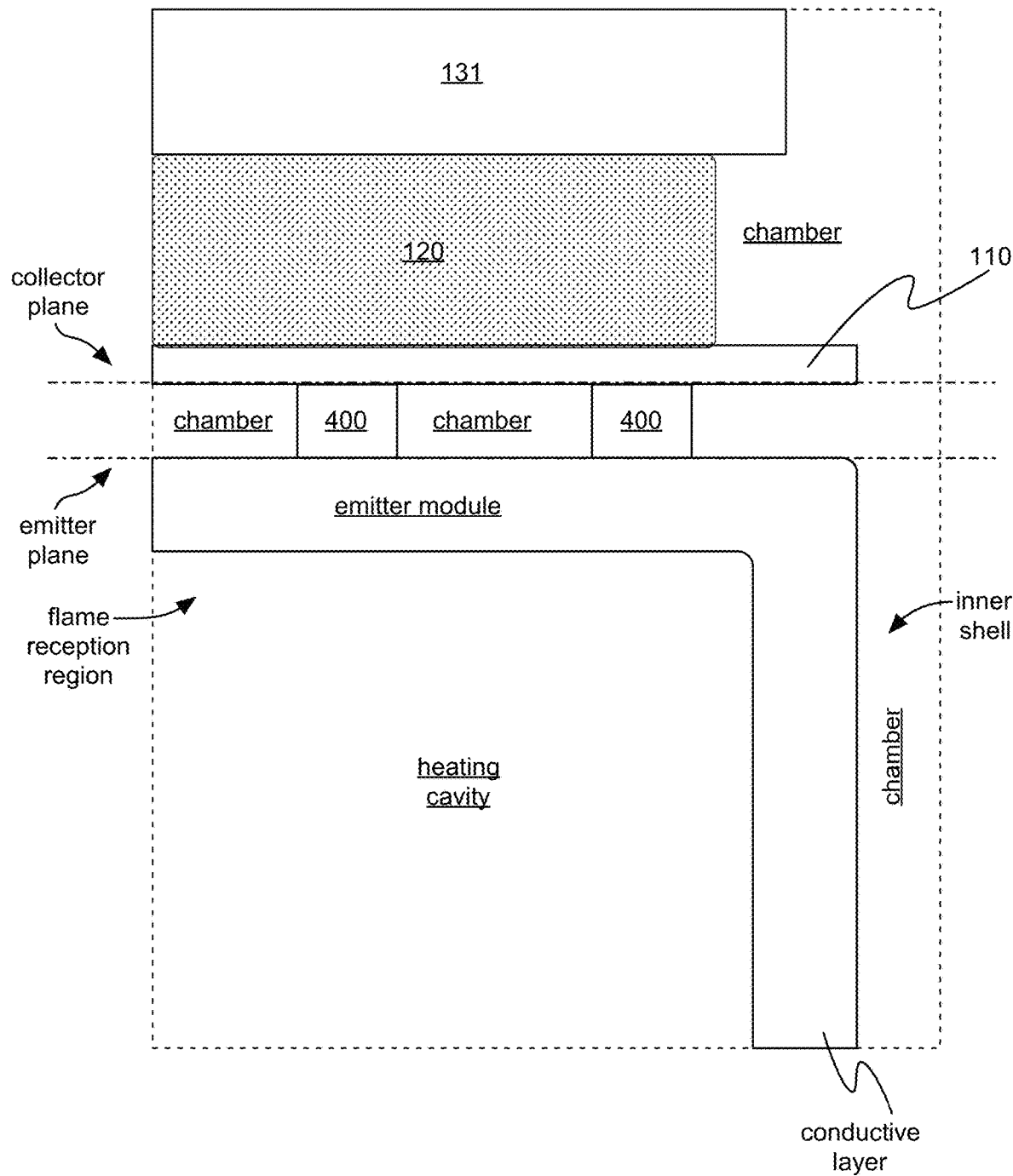
FIGS. 6A-6B are schematic representations of a cross-sectional view of a portion of a variant of the system and a specific example of the variant, respectively.
Figure 6B:
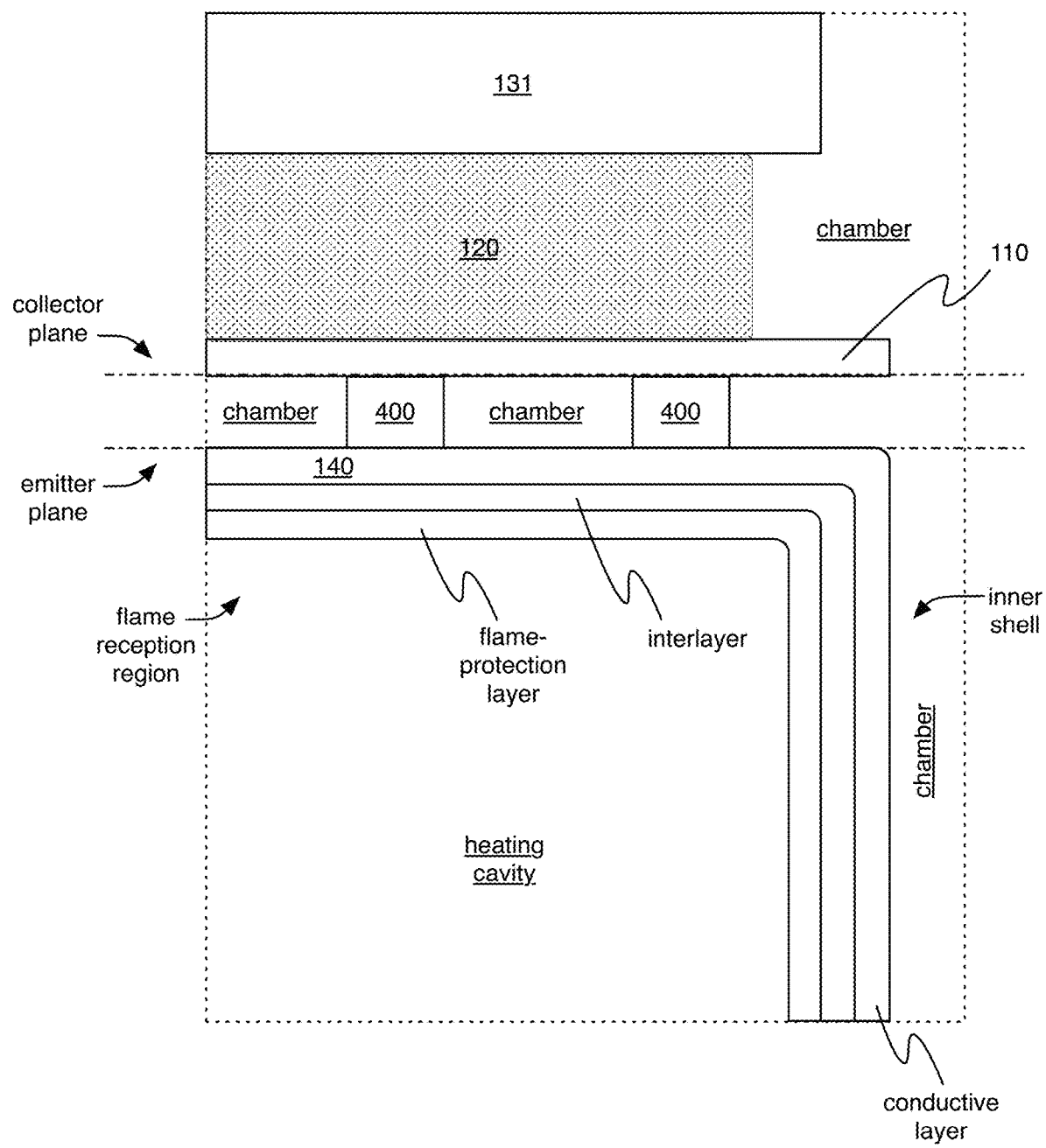

In some embodiments, the system includes one or more elements such as described in U.S. patent application Ser. No. 16/676,131, filed 6 Nov. 2019 and titled "SYSTEM AND METHOD FOR THERMIONIC ENERGY CONVERSION", which is herein incorporated in its entirety by this reference. For example, the system can include (e.g., be) the 'system 10 for thermionic energy generation' of U.S. patent application Ser. No. 16/676,131 (or a subset of the elements thereof), wherein the 'collector contacts 250' of U.S. patent application Ser. No. 16/676,131 can include the interfacial layer described herein (e.g., as shown in FIGS. 6A-6B); in a specific example, the collector contacts include a mechanically-compliant interfacial layer that includes a work function reducing fill material, such as cesium.

However, the system can additionally or alternatively include any other suitable elements in any suitable arrangement.

3. Methods.

A method for manufacturing the system (and/or any component of the system) can include any suitable step or steps (e.g., performed once or more than once) including: material growth, material deposition (e.g., microfabrication, nanofabrication, etc. such as atomic layer deposition; chemical vapor deposition; physical vapor deposition; sputtering; etching; combinations thereof; etc.), manual material manipulation (e.g., winding, machining, etc.), broaching (e.g., generating thin wire shavings using a broach), combustion of interfacial material precursors (e.g., metal bis (tetrazolato)amine BTA complexes), dealloying, nanosmelting, gamma ray irradiation, metal sol-gel processing, metal foam generation (e.g., injecting gas into molten metal, mixing foaming agent(s) into molten metal, casting metal using a foam skeleton, etc.), aligning structures and/or materials (e.g., bristles, stacking layers, etc.), intercalating materials (e.g., intercalating fill material into the interfacial layer and/or material), coating the interfacial layer (and/or interfacial material), and/or any suitable processing steps. The interfacial layer can be manufactured on the electron collector, on the encapsulation, and/or separately from the electron collector and/or the electron collector encapsulation. However, the system and/or components thereof can additionally or alternatively be manufactured in any other suitable manner.

Figure 7:
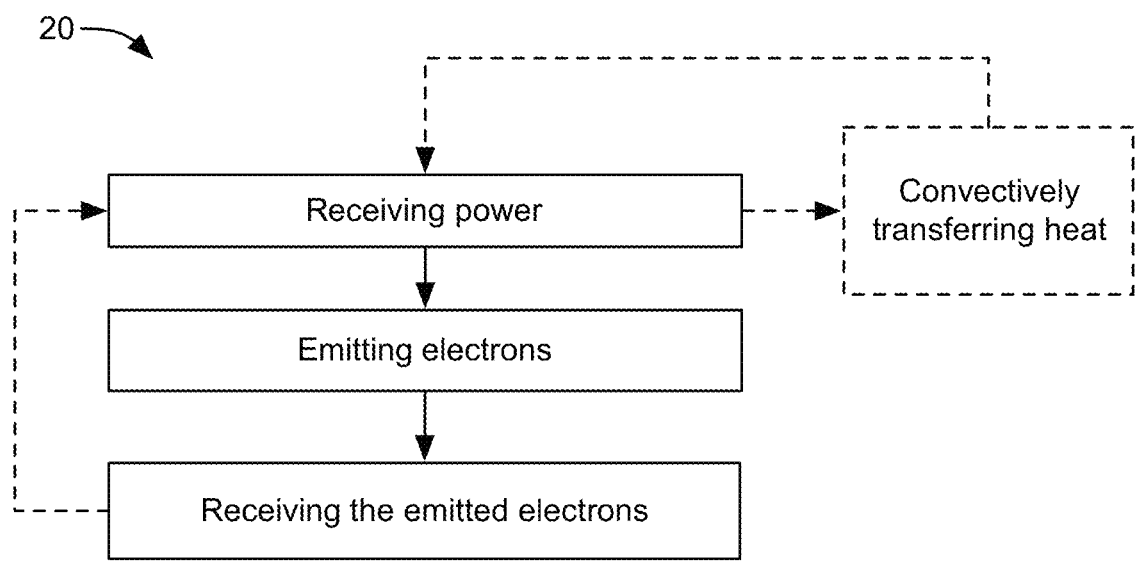
FIG. 7 is a schematic representation of a method for thermionic energy generation.

A method of operation 20 preferably includes receiving power, emitting electrons, and receiving the emitted electrons, and can optionally include convectively transferring heat and/or any other suitable elements (e.g., as shown in FIG. 7). The method is preferably performed using the system 10 for thermionic energy generation described above, but can additionally or alternatively be performed using any other suitable system(s).

The method for thermionic energy generation preferably functions to generate an electrical output (e.g., provide electrical power to an external load). The method preferably includes receiving power, emitting electrons, and receiving emitted electrons. The method can optionally include convectively transferring heat. However, the method can additionally or alternatively include any other suitable elements.

Receiving power is preferably performed within the heating cavity, more preferably near the electron emitter (e.g., at the inner shell, such as adjacent to the electron emitter). The power is preferably thermal power, but can additionally or alternatively include power from any other suitable source. The method can optionally include providing the received power. The power is preferably provided by the power input. The power is preferably provided continuously but can alternatively be provided with any other suitable timing. In one example, providing power includes operating a burner (e.g., arranged within the heating cavity) with one or more flames close to and/or incident upon the flame-reception region of the emitter module, wherein receiving powder includes receiving heat from the flame at the flame-reception region. However, receiving power can additionally or alternatively include any other suitable elements performed in any suitable manner.

Emitting electrons is preferably performed at (and/or near) the electron emitter. In response to receiving power (e.g., in response to the electron emitter reaching an elevated temperature, such as greater than a temperature within the range 400-500, 500-600, 600-700, 700-800, 800-1000, 1000-1600, or 1600-2000° C., etc.), the electron emitter preferably emits electrons (e.g., thermionically emits electrons). The electrons are preferably emitted into the chamber, more preferably toward the electron collector. However, emitting electrons can additionally or alternatively include any other suitable elements performed in any suitable manner.

Receiving emitted electrons is preferably performed at the electron collector. The electrons are preferably received from the electron emitter via the chamber. While receiving emitted electrons, the electron collector preferably has a lower temperature (and optionally has a lower work function) than the electron emitter, which can result in generation of electrical power from receipt of the emitted electrons. Receiving emitted electrons preferably includes providing the generated electrical power to an external electrical load (e.g., via conductive leads of the emitter and collector modules). However, receiving emitted electrons can additionally or alternatively include any other suitable elements performed in any suitable manner.

The method can optionally include convectively transferring heat. Convectively transferring heat can function to cool the electron collector and/or preheat burner gases. Convectively transferring heat is preferably performed by the airflow module, which can cause one or more fluids (e.g., air) to flow along elements of the system (e.g., along an airflow path defined by one or more ducts of the airflow module). The elements of the system that the fluid can flow along can include one or more of the cooling element, emitter module outer shell, emitter module inner shell, burner, and/or any other suitable elements. However, convectively transferring heat can additionally or alternatively include any other suitable elements performed in any suitable manner, and/or the method can additionally or alternatively include any other suitable elements performed in any suitable manner.

The method of operation can optionally include one or more elements (e.g., for 'work function reduction' and/or 'thermionic energy conversion') as disclosed in U.S. patent application Ser. No. 16/715,705, filed 16 Dec. 2019 and titled "SYSTEM AND METHOD FOR WORK FUNCTION REDUCTION AND THERMIONIC ENERGY CONVERSION", which is herein incorporated in its entirety by reference. However, the method of operation can additionally or alternatively include any other suitable elements.

Embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

The FIGURES illustrate the architecture, functionality and operation of possible implementations of systems and methods according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A system comprising a thermionic energy converter (TEC) defining a chamber, wherein the TEC comprises:
   an electron collector arranged within the chamber;
   an electron emitter opposing the electron collector across the chamber; and
   an interfacial layer arranged within the chamber, wherein:
      the electron collector is arranged between the electron emitter and the interfacial layer;
      the interfacial layer mechanically couples the electron collector to the chamber; and
      the interfacial layer defines a reservoir within the chamber, wherein the reservoir contains a work function reduction material.

2. The system of claim 1, wherein the chamber is fluidly isolated from an ambient environment surrounding the TEC.

3. The system of claim 2, wherein the chamber contains a vapor of the work function reduction material.

4. The system of claim 1, wherein the work function reduction material comprises liquid cesium.

5. The system of claim 4, further comprising a cooling element thermally coupled to the interfacial layer, wherein:
   the cooling element is arranged outside the chamber; and
   the interfacial layer is arranged between the cooling element and the electron collector.

6. The system of claim 5, wherein the cooling element is configured to control a temperature of the liquid cesium.

7. The system of claim 1, wherein the interfacial layer comprises a porous metal structure.

8. The system of claim 7, wherein the work function reduction material comprises cesium contained within pores of the porous metal structure, wherein a vapor of the cesium is fluidly coupled to an inter-electrode gap defined within the chamber between the electron emitter and the electron collector.

9. The system of claim 8, wherein the liquid cesium is configured to thermally couple the electron collector to a cooling element arranged outside the chamber.

10. The system of claim 1, further comprising:
   an inner shell defining a heating cavity, wherein the heating cavity opposes the chamber across the electron emitter and across the inner shell;
   an outer shell opposing the inner shell across the chamber, the outer shell electrically connected to the electron emitter via the inner shell;
   a collector module comprising the electron collector; and
   a seal comprising an electrical insulator, the seal arranged between the outer shell and the collector module;
wherein:
   the seal mechanically connects the outer shell to the collector module, thereby mechanically coupling the outer shell to the electron collector;
   the seal does not electrically connect the outer shell to the collector module; and
   the chamber is bounded by the electron emitter, the inner shell, the outer shell, the seal, and the collector module.

11. The system of claim 1, wherein the interfacial layer comprises a metal and a work function reduction material precursor, wherein the metal and the work function reduction material precursor are configured to react to generate the work function reduction material.

12. The system of claim 11, wherein the work function reduction material is cesium and the work function reduction material precursor is cesium chromate.

13. A system comprising a thermionic energy converter (TEC) defining a chamber, wherein the TEC comprises:
   an electron collector arranged within the chamber;
   an electron emitter opposing the electron collector across the chamber;
   a spacer arranged between the electron collector and electron emitter; and
   an interfacial layer arranged within the chamber, wherein:
      the electron collector is arranged between the electron emitter and the interfacial layer; and
      the interfacial layer maintains the electron collector in contact with the spacer, thereby maintaining an inter-electrode gap between the electron collector and the electron emitter.

14. The system of claim 13, wherein the interfacial layer is mechanically compliant and is held in compression between the electron collector and a chamber boundary such that the interfacial layer urges the electron collector toward the electron emitter.

15. The system of claim 14, wherein the interfacial layer has a spring constant between 10 kN/m and 500 kN/m.

16. The system of claim 14, wherein the interfacial layer comprises a porous metal structure, wherein the porous metal structure is mechanically compliant.

17. The system of claim 13, wherein the chamber is fluidly isolated from an ambient environment surrounding the TEC.

18. The system of claim 17, wherein:
   the interfacial layer comprises a porous metal structure; and
   the system comprises liquid cesium that fills a portion of the porous metal structure.

19. The system of claim 18, wherein the porous metal structure comprises nickel-coated copper.

20. The system of claim 13, wherein:
   the interfacial layer contacts the electron collector at a broad face; and
   the interfacial layer defines a thickness, along an axis normal to the broad face, between 0.05 mm and 10 mm.

* * * * *